(12) United States Patent
Cho et al.

(10) Patent No.: US 10,145,891 B2
(45) Date of Patent: Dec. 4, 2018

(54) APPARATUS AND METHOD USING PROGRAMMABLE RELIABILITY AGING TIMER

(71) Applicant: Samsung Electronics Co., Ltd., Suwon-si, Gyeonggi-do (KR)

(72) Inventors: Yong-sang Cho, Hwaseong-si (KR); Chang-ok You, Yongin-si (KR); Jae-won Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 356 days.

(21) Appl. No.: 14/856,837

(22) Filed: Sep. 17, 2015

(65) Prior Publication Data

US 2016/0116529 A1 Apr. 28, 2016

(30) Foreign Application Priority Data

Oct. 23, 2014 (KR) .................. 10-2014-0144283

(51) Int. Cl.
*G01R 31/28* (2006.01)
*G01R 31/30* (2006.01)

(52) U.S. Cl.
CPC ..... *G01R 31/2874* (2013.01); *G01R 31/3004* (2013.01); *G01R 31/3012* (2013.01)

(58) Field of Classification Search
CPC .............. G01N 33/60; G01N 33/5014; G01R 31/2874; G01R 31/3012
USPC .... 324/500, 750.15–750.28, 750.03–750.07, 324/670, 685, 721, 760
See application file for complete search history.

(56) References Cited

U.S. PATENT DOCUMENTS

| | | |
|---|---|---|
| 6,288,958 B1 | 9/2001 | Suzuki |
| 6,404,219 B1 | 6/2002 | Yamamoto |
| 6,426,640 B1 | 7/2002 | Wirth et al. |
| 6,426,904 B2 | 7/2002 | Barth et al. |
| 6,483,334 B1 | 11/2002 | Hsieh |
| 6,747,471 B1 | 6/2004 | Chen et al. |
| 6,806,494 B2 | 10/2004 | Fenner et al. |
| 6,943,575 B2 | 9/2005 | Marr |
| 7,023,228 B2 | 4/2006 | Maesaki et al. |
| 7,023,229 B2 | 4/2006 | Maesaki et al. |
| 7,038,481 B2 | 5/2006 | Marr |
| 7,200,059 B2 * | 4/2007 | Fujioka ............. G11C 29/10 365/201 |
| 7,200,095 B2 * | 4/2007 | Kojima .............. G11B 7/268 369/101 |

(Continued)

*Primary Examiner* — Melissa Koval
*Assistant Examiner* — Trung Nguyen
(74) *Attorney, Agent, or Firm* — Harness, Dickey & Pierce, P.L.C.

(57) ABSTRACT

An apparatus and a method which use a programmable reliability aging timer are provided. The apparatus includes a performance circuit configured to perform a function of an integrated circuit (IC), a memory unit configured to store a lifetime of the IC, a controller configured to set an aging target condition according to the lifetime stored in the memory unit, and a reliability aging timer (RAT) configured to apply stress to a test pattern according to the aging target condition and sense a result of the stress to determine the degradation of the IC. The RAT refreshes an operation of the performance circuit if it is determined that the IC degraded before the lifetime of the IC.

19 Claims, 6 Drawing Sheets

(56) References Cited

U.S. PATENT DOCUMENTS

| | | | |
|---|---|---|---|
| 7,271,608 B1 * | 9/2007 | Vermeire | G01R 31/2856 324/750.3 |
| 7,337,378 B2 | 2/2008 | Kondou | |
| 7,473,568 B2 | 1/2009 | Co et al. | |
| 8,161,431 B2 | 4/2012 | Buonpane et al. | |
| 2013/0154723 A1 | 6/2013 | Ko et al. | |
| 2013/0285685 A1 * | 10/2013 | Bowman | G06F 1/10 324/750.3 |

* cited by examiner

APPARATUS AND METHOD USING PROGRAMMABLE RELIABILITY AGING TIMER

CROSS-REFERENCE TO RELATED APPLICATION

This application claims the benefit of Korean Patent Application No. 10-2014-0144283, filed on Oct. 23, 2014, in the Korean Intellectual Property Office, the disclosure of which is incorporated herein in its entirety by reference.

BACKGROUND

The inventive concepts presented relate to a semiconductor integrated circuit (IC), and more particularly, to a method and apparatus for ensuring the reliability of an IC by controlling a reliability aging timer according to a lifetime demanded by a customer.

Due to the development of semiconductor manufacturing technologies, various circuit devices such as metal oxide semiconductor (MOS) transistors are formed in ICs. ICs are used in customer electronics and are required to provide optimum operational performance in various application uses. The reliability of the ICs has to satisfy a reliability minimum requirement to ensure the performance of the ICs during a predetermined minimum period. An IC that does not satisfy the reliability minimum requirement is determined to be a defective IC during a test process of a production stage, and an IC having an insufficient reliability margin is sold at a low price, thereby reducing yield. The lifetime of an IC may vary depending on the demands of individual customers. If a reliability minimum condition and/or a reliability margin are changed according to the lifetime of an IC, IC productivity may be improved.

SUMMARY

The inventive concepts provide an apparatus for ensuring the reliability of an integrated circuit (IC) by controlling a reliability aging timer according to a lifetime requested, desired, demanded, and/or required by a customer.

The inventive concepts also provide a method of ensuring the reliability of an IC by controlling a reliability aging timer according to a lifetime requested, desired, demanded and/or required by a customer.

According to an aspect of the inventive concepts, there is provided a method of using a reliability aging timer (RAT), that may include inputting a lifetime of an integrated circuit (IC) into memory of a reliability aging time (RAT), setting an aging target condition of the RAT according to the lifetime of the IC, applying stress to a test pattern of the RAT according to the aging target condition and sensing a result of the stress, determining whether an IC has degraded before the end of the lifetime of the IC as a result of the stress, and refreshing an operation of the IC if the determining has determined that the IC degraded before the lifetime as a result of the stress.

The inputting of the lifetime of the IC may include inputting a lifetime that is in accordance with a desired lifetime of the IC.

The method may further include continuing an operation of the IC if the determining has determined that the IC did not degrade as a result of the stress.

The method may further include suspending an operation of the IC if the determining has determined that the IC degraded in accordance with the lifetime of the IC as a result of the stress.

The method may further include replacing an intellectual property (IP) block included in the IC with a redundancy IP block if the determining has determined that the IP block included in the IC was defective or failed before the end of the lifetime of the IC as a result of the stress.

The applying of the stress to the test pattern of the RAT and the sensing of the result of the stress may include applying a drain voltage of an N-type metal oxide semiconductor (NMOS) transistor of the IC to a hot carrier injection (HCI) test pattern for the evaluation of characteristics of the NMOS transistor and sensing a drain-source current.

The applying of the stress to the test pattern of the RAT and the sensing of the result of the stress may include applying a gate voltage of a P-type metal oxide semiconductor (PMOS) transistor of the IC to a negative biased temperature instability (NBTI) test pattern for the evaluation of characteristics of the PMOS transistor and sensing a drain-source current.

The applying of the stress to the test pattern of the RAT and the sensing of the result of the stress may include applying a gate voltage of a transistor gate dielectric layer of the IC to a time dependent dielectric breakdown (TDDB) test pattern for the evaluation of characteristics of the transistor gate dielectric layer and sensing a gate current.

The applying of the stress to the test pattern of the RAT and the sensing of the result of the stress may include applying a current to a stress migration (SM) test pattern or electro-migration (EM) test pattern for the evaluation of characteristics of an interconnection layer and a via in the IC and sensing whether a short circuit occurs due to the current.

The applying of the stress to the test pattern of the RAT may include using a temperature adjustor, the temperature adjustor configured to measure a temperature of the test pattern and adjust the temperature of the test pattern of the RAT to maintain a temperature suitable for the lifetime of the IC according to the stress.

According to another aspect of the inventive concepts, there is provided an apparatus that may include a performance circuit including an integrated circuit (IC), a memory unit configured to store a lifetime of the IC; a controller configured to set an aging target condition according to the lifetime stored in the memory unit, and a reliability aging timer (RAT) configured to apply stress to a test pattern according to the aging target condition and sense a result of the stress to determine the degradation of the IC. The RAT may refresh an operation of the performance circuit if the RAT determines that the IC degraded before the lifetime of the IC.

The RAT may be configured to allow the performance circuit to continuously operate if the RAT determines that the IC did not degrade as a result of the stress.

The RAT may be configured to suspend an operation of the performance circuit when the RAT determines that the IC degraded in accordance with the lifetime as a result of the stress.

The RAT may be configured to replace an intellectual property (IP) block included in the IC with a redundancy IP block if the RAT determines that the IP block included in the IC was defective or failed before the end of the lifetime of the IC as a result of the stress.

The lifetime of the IC may be provided to the memory unit according to a desired lifetime of the IC.

The test pattern of the RAT may include at least one selected from a hot carrier injection (HCI) test pattern, a negative biased temperature instability (NBTI) test pattern, a time dependent dielectric breakdown (TDDB) test pattern, a stress migration (SM) test pattern, and an electro-migration (EM) test pattern.

The test pattern of the RAT may be connected to a temperature adjustor configured to measure a temperature of the test pattern and maintain a temperature suitable for the lifetime of the IC according to the stress by adjusting the temperature of the test pattern of the RAT.

According to another aspect of the inventive concepts, there is provided a system that may include a plurality of intellectual property (IP) blocks, and an IP controller connected to the plurality of IP blocks and configured to control operations of the plurality of IP blocks. The IP controller may include a memory unit configured to store a lifetime of the system, a controller configured to set an aging target condition according to the lifetime stored in the memory unit, and a reliability aging timer (RAT) configured to apply stress to a test pattern according to the aging target condition and sense a result of the stress to determine whether the plurality of IP blocks degraded. The RAT may refresh operations of the plurality of IP blocks when the RAT determines that the plurality of IP blocks degraded before the end of the lifetime of the system as a result of the stress.

According to another aspect of the inventive concepts, there is provided a method of ensuring the reliability of an integrated circuit (IC) by controlling a reliability aging timer (RAT) that may include, setting a desired performance expectancy for a plurality of intellectual property (IP) blocks, determining stress conditions to be used in a stress test of the IP blocks based on the desired performance expectancy, performing a stress test in accordance with the stress conditions on at least one of the plurality of IP blocks, monitoring the results of the stress test on the at least one of the plurality of IP blocks, determining whether degradation of the at least one of the plurality of IP blocks has occurred based on the results of the stress test, and performing an operation of the IC based on the results of the determining.

The method may further include determining whether the degradation of the at least one of the plurality of IP blocks is in accordance with the desired performance expectancy. The method may further include wherein the at least one of the plurality of IP blocks is a performance test IP block. The method may also include wherein the performing the stress test includes performing at least one of a hot carrier injection test, a negative biased temperature instability test, a time dependent dielectric breakdown test, a stress migration test, and an electro-migration test. The operation of the IC may also include at least one of refreshing an operation of the IC, continuing an operation of the IC, suspending an operation of the IC, and replacing an intellectual property (IP) block included in the IC with a redundancy IP block.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
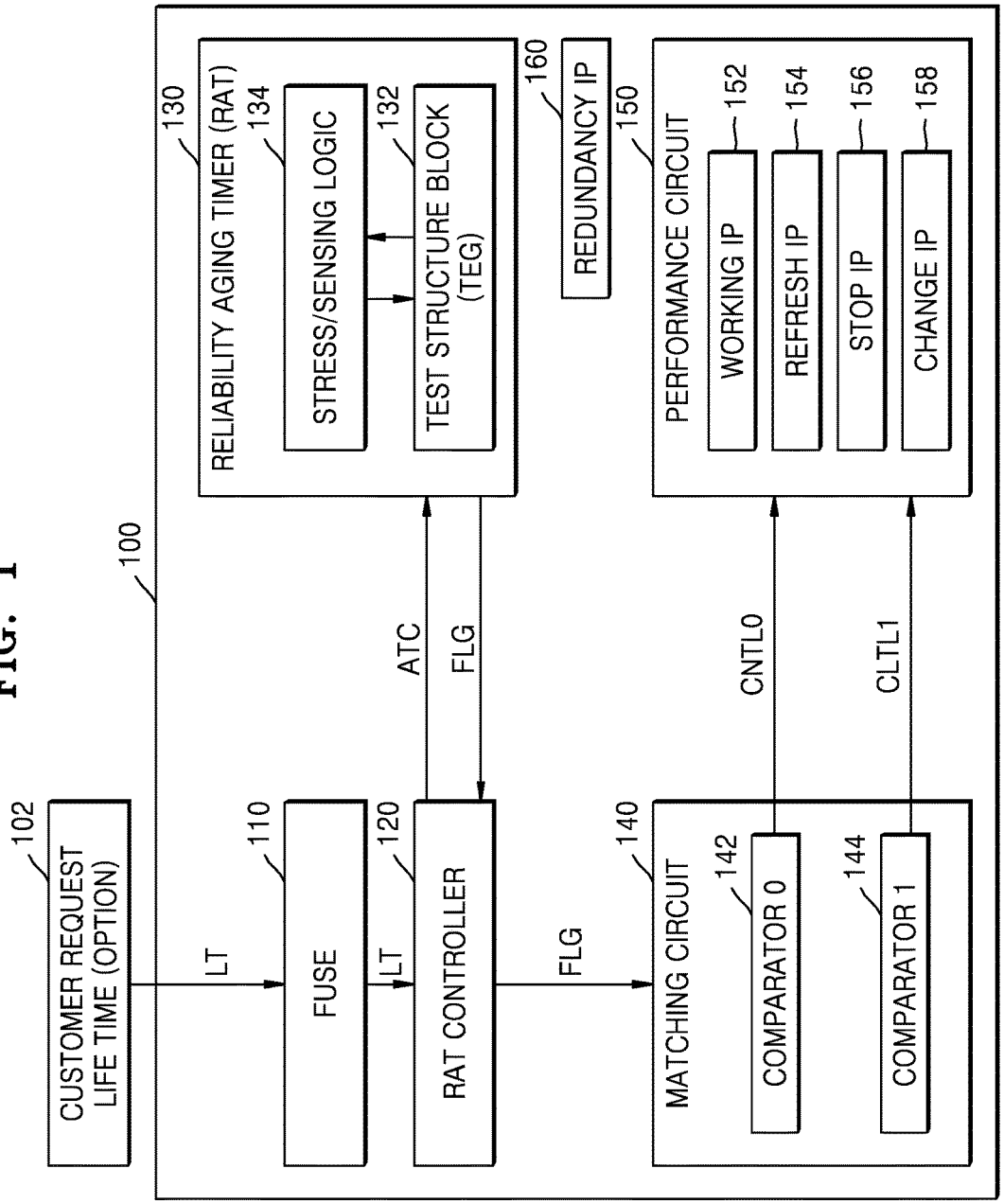
FIG. 1 is a block diagram of an apparatus including a programmable reliability aging timer (RAT), according to an example embodiment.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram of an apparatus 100 including a programmable reliability aging timer (RAT) 130, according to an example embodiment. The apparatus 100 may adaptively ensure the reliability of an integrated circuit (IC) according to a lifetime requested, desired, demanded and/or required by the IC manufacturer, customer, end user, or the like. In other words, the apparatus 100 may be configured in order to meet a minimum and/or desired performance expectancy. The apparatus 100 may be implemented with a system on chip (SoC) including semiconductor intellectual property (IP) blocks. Additionally, the apparatus 100 may also be implemented as a plurality of ICs or SoCs with interconnections between the ICs or SoCs, for example using a databus. For convenience of explanation, the apparatus 100 will be referred to as an IC.

Referring to FIG. 1, the apparatus 100 may include a memory unit 110, an RAT controller 120, the RAT 130, a matching circuit 140, and a performance circuit 150.

The memory unit 110 may store a requested, desired, demanded and/or required lifetime, or desired performance expectancy, of an IC (hereinafter, referred to as an IC lifetime). The IC lifetime may be any one of a selected from a lifetime requested, desired, demanded and/or required by a customer, or the like, and a lifetime provided by an IC manufacturer. The memory unit 110 may receive a lifetime requested, desired, demanded and/or required by a customer (hereinafter, referred to as a customer demand lifetime) from an external source 102. According to an example embodiment, the customer demand lifetime received from the external source 102 may also be stored in the performance circuit 150 including first to fourth IP blocks 152, 154, 156, and 158. The first to fourth IP blocks 152, 154, 156, and 158 may selectively refresh or stop operations thereof or be replaced with a redundancy IP block 160, by taking into account the customer demand lifetime.

The IC lifetime that is stored in the memory unit 110 is a time ensuring that the IC operates at the same and/or desired performance as when the IC is shipped, in a field in which a system mounted with the IC operates. For example, it is assumed that a lifetime provided by an IC manufacturer is set to ten years and a demanded lifetime is set to two years. An aging test for testing IC performance degradation that is caused due to the aging of an IC may be performed to ensure an IC lifetime. In the aging test, an IC having a lifetime of two years may not be relatively strict about satisfying a reliability minimum requirement and/or a reliability margin, compared to an IC having a lifetime of ten years. Aging target conditions for satisfying a reliability minimum condition and/or a reliability margin according to a lifetime of two years may have less influence on a change in IC performance. Accordingly, it is highly likely that an IC having a lifetime of two years is not determined to be a defective IC in an aging test process, thereby improving productivity.

According to an example embodiment, the memory unit 110 may be implemented using a one-time programmable memory, such as a laser-programmable fuse array, an anti-fuse array, an electrical programmable fuse array, or the like, or may be implemented with a nonvolatile memory device, such as magnetic random access memory (MRAM), resistance random access memory (RRAM), phase change random access memory (PRAM), flash memory, or the like.

The RAT controller 120 may set aging target conditions ATC of the RAT 130 according to an IC lifetime LT that may be output from the memory unit 110. The aging target conditions ATC of the RAT 130 may control the operational environment of an IC to be suitable for test contents. The aging target conditions ATC may use voltage, current, and/or temperature, or the like as stress conditions. The operational performance of an IC may be determined when electrical characteristic degradation that may be caused by the aging target conditions ATC may be sensed. The RAT controller 120 may provide the IC lifetime LT and the aging target conditions ATC to the RAT 130.

The RAT 130 may include a test block 132 for observing aging phenomena of an IC and a stress and sensing logic unit 134 for controlling the test block 132 according to the aging target conditions ATC.

Figure 2:
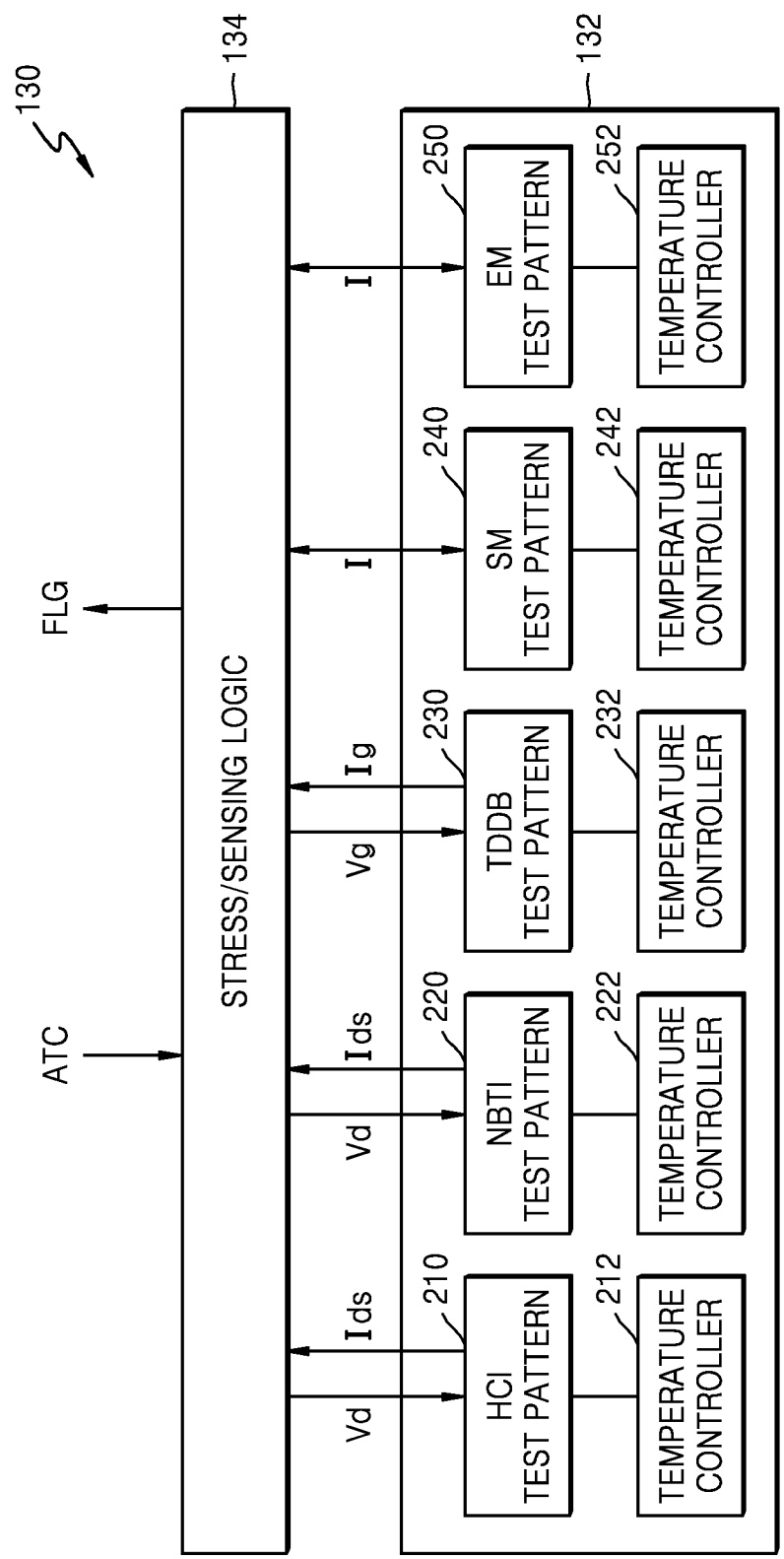
FIG. 2 is a block diagram of the RAT illustrated in FIG. 1, according to an example embodiment.

The test block 132 may include a plurality of test element groups (TEGs). As illustrated in FIG. 2, the test block 132 may include a hot carrier injection (HCI) test pattern 210, a negative biased temperature instability (NBTI) test pattern 220, a time dependent dielectric breakdown (TDDB) test pattern 230, a stress migration (SM) test pattern 240, and an electro-migration (EM) test pattern 250.

The HCI test pattern 210 may be provided for the evaluation of characteristics of an N-type metal oxide semiconductor (NMOS) transistor. The size of the NMOS transistor may be reduced due to continuous semiconductor process scaling, and thus, an electric field between a source and a drain may increase also in the same operating voltage and thus characteristic degradation by HCI may occur. The HCI test pattern 210 may set a MOS transistor, and particularly a drain voltage Vd of the NMOS transistor, as the aging target conditions ATC.

The drain voltage Vd that may be applied to the HCI test pattern 210 may be split into several voltages, and the aging of the NMOS transistor may be performed according to the split drain voltage Vd. The HCI test pattern 210 may be connected to a temperature controller 212 to maintain the aging environment of the NMOS transistor. The temperature controller 212 may measure the temperature of the HCI test pattern 210 and provide a temperature suitable for a set lifetime LT as aging requisites of the NMOS transistor.

The NBTI test pattern 220 may be provided for the evaluation of characteristics of a P-type MOS (PMOS) transistor. The size of a PMOS transistor may be reduced due to continuous semiconductor process scaling, and thus, a threshold voltage Vth of the PMOS transistor may be reduced. As a result of the reduction in the size and threshold voltage of a PMOS transistor, the shift of the threshold voltage Vth of the PMOS transistor, which may be caused by NBTI, may raise issues of performance degradation and voltage sensitivity. The shift of the threshold voltage Vth, which may be caused by NBTI, may be expressed as a function of a gate voltage Vg with respect to the source and drain voltages of the PMOS transistor. The NBTI test pattern 220 may set the gate voltage Vg of the PMOS transistor as the aging target conditions ATC.

The gate voltage Vg that may be applied to the NBTI test pattern 220 may be split into several voltages, and the aging of the PMOS transistor may be performed according to the split gate voltage Vg. The NBTI test pattern 220 may be connected to a temperature controller 222 to maintain the aging environment of the PMOS transistor. The temperature controller 222 may measure the temperature of the NBTI test pattern 220 and provide a temperature suitable for a set lifetime LT as aging requisites of the PMOS transistor.

The TDDB test pattern 230 may be provided for the evaluation of characteristics of a dielectric layer. The TDDB test pattern 230 may be used to electrically measure and evaluate a breakdown voltage of a dielectric layer, for example, a gate dielectric layer or a capacitor dielectric layer, and to measure and evaluate a time for which the dielectric layer may be damaged. The TDDB test pattern 230 may set a gate voltage Vg of a gate dielectric layer as the aging target conditions ATC.

The gate voltage Vg that may be provided to the TDDB test pattern 230 may be split into several voltages, and the aging of the gate dielectric layer may be performed according to the split gate voltage Vg. The TDDB test pattern 230 may be connected to a temperature controller 232 to maintain the aging environment of the gate dielectric layer. The temperature controller 232 may measure the temperature of the TDDB test pattern 230 and provide a temperature suitable for a set lifetime LT as aging requisites of the gate dielectric layer.

The SM test pattern 240 may be provided for the evaluation of characteristics of an interconnection layer, such as a copper line, or a via. Stress migration means a phenomena, such as the generation of voids and hillocks, which are due to or related to stress in an interconnection line, an interfacial separation occurring due to a sliding, and a crack occurring due to the transformation of an interconnection line. The SM test pattern 240 may be variously formed so that the interconnection layer is stacked together with various materials. The SM test pattern 240 may set various compositions and temperatures as the aging target conditions ATC.

The SM test pattern 240 may be connected to a temperature controller 242 to maintain the aging environment of the interconnection layer. The temperature controller 242 may apply a high temperature to the SM test pattern 240 to induce the transformation of an interconnection line due to a thermal expansion coefficient difference between composition materials so that the aging of the interconnection layer may be performed.

The EM test pattern 250 may be provided for the evaluation of characteristics of an interconnection layer, such as a metal line, and a via. When various currents are applied to the EM test pattern 250, metal particles (for example, aluminum particles) move in a metal line itself due to the flow of electrons, and an interconnection defect may occur while a void occurs in a portion in which the metal particles move. The EM test pattern 250 may be connected to a temperature controller 252 to maintain the aging environment of the interconnection layer. The temperature controller 252 may apply a high temperature to the EM test pattern 240 to thereby perform the aging of the interconnection layer.

According to an example embodiment, the test block 132 may be configured so that the HCI test pattern 210, the NBTI test pattern 220, the TDDB test pattern 230, the SM test pattern 240, and the EM test pattern 250 are not connected respectively to the temperature controllers 212, 222, 232, 242, and 252. That is, the test block 132 may selectively not include the temperature controllers 212, 222, 232, 242, and 252. Accordingly, an area of the test block 132 may be reduced and thus an IC area of the apparatus 100 may be reduced.

The stress and sensing logic unit 134 may provide stresses to the TEGs in the test block 132 according to the aging target conditions ATC that are output from the RAT controller 120. The stress and sensing logic unit 134 may apply a drain voltage Vd to the HCI test pattern 210, apply a gate voltage Vg to the NBTI test pattern 220, apply a gate voltage Vg to the TDDB test pattern 230, and apply a current I to the SM test pattern 240 and the EM test pattern 250.

The stress and sensing logic unit 134 may monitor and sense characteristics of the TEGs in the test block 132 which may vary due to the stresses applied according to the aging target conditions ATC. The stress and sensing logic unit 134 may determine whether degradation occurred, based on the sensed characteristics of the TEGs.

The stress and sensing logic unit 134 may sense a drain-source current Ids according to the drain voltage Vd applied to the HCI test pattern 210 and determine whether the degradation of an NMOS transistor occurred, based on a sensed result. The stress and sensing logic unit 134 may sense a drain-source current Ids according to the gate voltage Vg applied to the NBTI test pattern 220 and determine whether the degradation of a PMOS transistor occurred, based on a sensed result. The stress and sensing logic unit 134 may sense a gate current Ig according to the gate voltage Vg applied to the TDDB test pattern 230 and determine whether the degradation of a gate dielectric layer occurred, based on a sensed result. The stress and sensing logic unit 134 may sense whether a short circuit occurs due to the current I applied to the SM test pattern 240 and the EM test pattern 250, and may determine whether the degradation of an interconnection layer and a via occurred, based on a sensed result.

The stress and sensing logic unit 134 may generate a flag signal FLG with respect to degradation characteristics of each of the TEGs in the test block 132. That is, the stress and sensing logic unit 134 may determine whether degradation occurred with respect to a stress result of the HCI test pattern 210, the NBTI test pattern 220, the TDDB test pattern 230, the SM test pattern 240, or the EM test pattern 250, and may generate the flag signal FLG based on a determined result. The flag signal FLG may be logic '1' indicating characteristic degradation and may be logic '0' indicating an opposite state.

According to an example embodiment, the stress and sensing logic unit 134 may output the flag signal FLG by performing an AND operation or an OR operation with respect to the characteristic degradations of the TEGs. According to another example embodiment, the flag signal FLG may have multiple levels. The flag signal FLG having multiple levels may control an IP block, which needs level trimming, in the performance circuit 150 of FIG. 1. The flag signal FLG may be provided to the matching circuit 140 through the RAT controller 120 of FIG. 1.

The matching circuit 140 may receive the flag signal FLG from the RAT controller 120 and generate first and second control signals CNTL0 and CNLT1 for controlling the first to fourth IP blocks 152, 154, 156, and 158 of the performance circuit 150 according to a logic level of the flag signal FLG. The matching circuit 140 may include a first comparator 142 that determines whether a logic level of the flag signal FLG is logic '0', and a second comparator 144 that determines whether a logic level of the flag signal FLG is logic '1'.

The first comparator 142 may generate the first control signal CNTL0 when the flag signal FLG is logic '0'. For example, since logic '0' of the flag signal FLG means that the TEGs in the test block 132 do not degrade after stress is applied to the TEGs, the first to fourth IP blocks 152, 154, 156, and 158 in the performance circuit 150 are not expected to degrade. Accordingly, the first control signal CNTL0 may be provided to the performance circuit 150 and control the performance circuit 150 so that the first to fourth IP blocks 152, 154, 156, and 158 may continuously operate. In the current example embodiment, the case in which the first IP block 152 continuously operates is described.

The second comparator 144 may generate the second control signal CNTL1 when the flag signal FLG is logic '1'. For example, since logic '1' of the flag signal FLG means that the TEGs in the test block 132 degrade after stress is applied to the TEGs, the first to fourth IP blocks 152, 154, 156, and 158 in the performance circuit 150 are expected to degrade. Accordingly, the second control signal CNTL1 may be provided to the performance circuit 150 and selectively control the performance circuit 150 so as to refresh or suspend operations of the first to fourth blocks 152, 154, 156, and 158 or replace the first to fourth blocks 152, 154, 156, and 158 with other IP blocks. In the current example embodiment, the case in which an operation of the second IP block 154 is refreshed, an operation of the third IP block 156 is suspended, and the fourth IP block 158 is replaced with a redundancy IP block is described.

The second IP block 154 may be refreshed to remove an aging state of the second IP block 154 in response to the second control signal CNTL1 indicating the degradation of the TEGs in the test block 132. That is, an operation of the second IP block 154 may be refreshed to prevent the performance of the second IP block 154 from being degraded before the lifetime LT stored in the memory unit 110 or the performance circuit 150. Accordingly, the productivity of the IC may be improved. The refreshment of an operation of the second IP block 154 means adjustment for securing a reliability margin, such as adjusting a power level that is supplied to the second IP block 154 or adjusting a voltage level of a signal that is input to the second IP block 154.

An operation of the third IP block 156 may be suspended in response to the second control signal CNTL1. This means that an operation of the third IP block 156 is suspended according to the lifetime LT stored in the memory unit 110 or the performance circuit 150. Power that is supplied to the third IP block 156 may be blocked to suspend an operation of the third IP block 156. Accordingly, a new demand for the IC may be created.

The fourth IP block 158 may be replaced with the redundancy IP block 160 in response to the second control signal CNTL1. The redundancy IP block 160 may be an extra IP block that is provided to repair an IP block that is determined to be a defective or failed IP block during an IC operation among the first to fourth IP blocks 152, 152, 154, 156, and 158. When the fourth IP block 158 is defective or failed before the lifetime LT stored in the memory unit 110 or the performance circuit 150, the fourth IP block 158 may be replaced with the redundancy IP block 160. In this case, the redundancy IP block 160 may be an IP block having the same function and performance as the fourth IP block 158.

Figure 3:
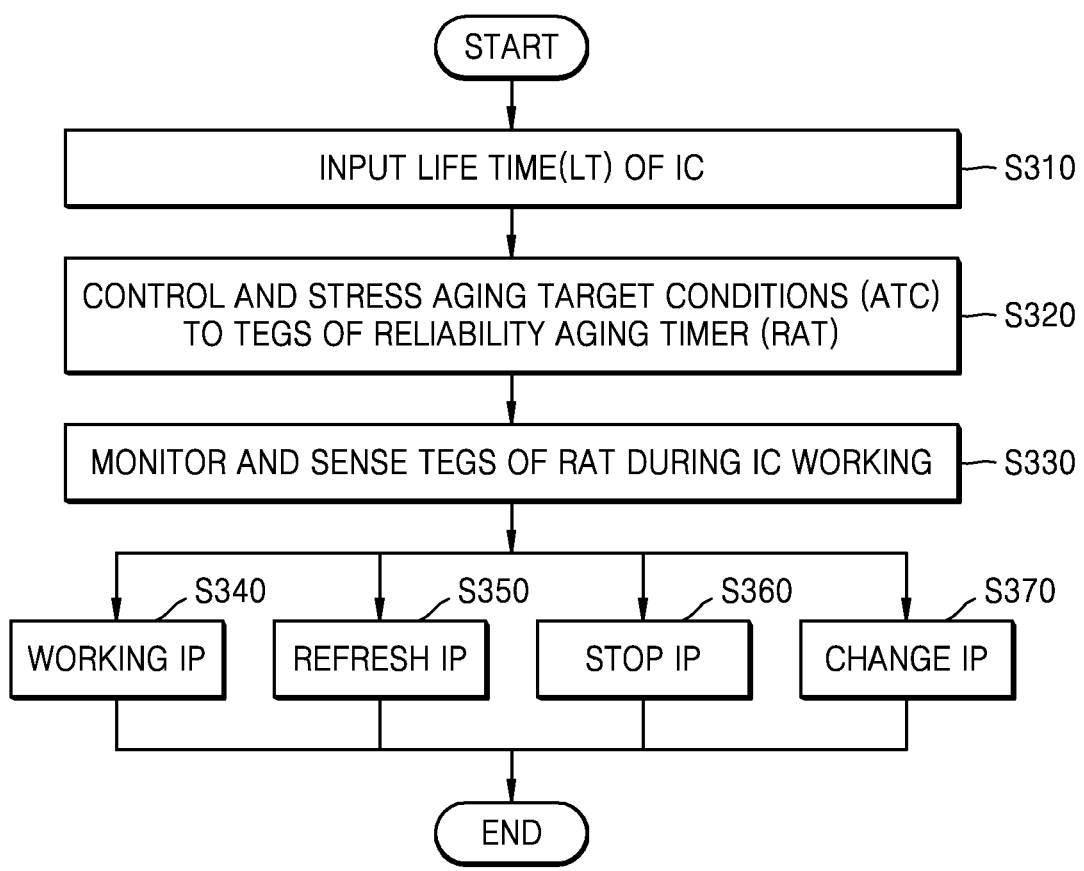
FIG. 3 is a flowchart illustrating an operation of the apparatus of FIG. 1, to an example embodiment.

FIG. 3 is a flowchart illustrating an operation of the apparatus 100 of FIG. 1.

Referring to FIG. 3 in line with FIG. 1, the apparatus 100 may input a lifetime LT of an IC (operation S310). The lifetime LT of the IC may be a lifetime that is requested, desired, demanded and/or required by a customer, or the like, or a lifetime that is provided from an IC manufacturer. The lifetime LT of the IC may be stored in the memory unit 110 and/or the performance circuit 150.

The apparatus 100 may control aging target conditions ATC of the RAT 130 according to the lifetime LT and apply stresses to the TEGs of the RAT 130 according to the aging target conditions ATC (operation S320). The aging target conditions ATC may be applied to be suitable to aging contents of the TEGs. A drain voltage Vd may be applied to the HCI test pattern 210, a gate voltage Vg may be applied to the NBTI test pattern 220, a gate voltage Vg may be applied to the TDDB test pattern 230, and a high temperature and/or a current may be applied to the SM test pattern 240 and the EM test pattern 250.

The apparatus 100 may monitor and sense characteristics of the TEGs, which may vary due to stresses applied according to the aging target conditions ATC during an operation of an IC (operation S330). Whether characteristic degradation of the TEGs occurred may be determined based on sensed characteristics of the TEGs.

The apparatus 100 may sense a drain-source current Ids according to the drain voltage Vd applied to the HCI test pattern 210 and determine whether the degradation of an NMOS transistor occurred, based on a sensed result. The apparatus 100 may sense a drain-source current Ids according to the gate voltage Vg applied to the NBTI test pattern 220 and determine whether the degradation of a PMOS transistor occurred, based on a sensed result. The apparatus 100 may sense a gate current Ig according to the gate voltage Vg applied to the TDDB test pattern 230 and determine whether the degradation of a gate dielectric layer occurred, based on a sensed result. The apparatus 100 may sense whether a short circuit occurs due to the current applied to the SM test pattern 240 and the EM test pattern 250, and may determine whether the degradation of an interconnection layer and a via occurred, based on a sensed result.

The apparatus 100 may determine whether the degradation of the IC occurred with respect to a stress result of the HCI test pattern 210, the NBTI test pattern 220, the TDDB test pattern 230, the SM test pattern 240, or the EM test pattern 250. Also, the apparatus 100 may perform an AND operation or an OR operation with respect to stress results of the HCI test pattern 210, the NBTI test pattern 220, the TDDB test pattern 230, the SM test pattern 240, and/or the EM test pattern 250 to thereby determine whether the degradation of the IC occurred.

The apparatus 100 may selectively control operations of the first to fourth IP blocks 152, 154, 156, and 158 according to whether the degradation of the IC occurred (operations S340, S350, S360, and S370). If it is determined that the IC did not degrade as a result of an aging stress of the TEGs, the apparatus 100 may control the first to fourth IP blocks 152, 154, 156, and 158 so that the first to fourth IP blocks 152, 154, 156, and 158 may continuously operate (operation S340). For example, the apparatus 100 may control the first IP block 152 so that the first IP block 152 continuously operates.

If it is determined that the IC degraded before the lifetime LT stored in the memory unit 110 or the performance circuit 150 as a result of an aging stress of the TEGs, the apparatus 100 may refresh operations of the first to fourth IP blocks 152, 154, 156, and 158 to extend the function and performance of the IC (operation S350). For example, when an operation of the second IP block 154 is refreshed, a power level that is supplied to the second IP block 154 may be adjusted or a voltage level of a signal that is input to the second IP block 154 may be adjusted.

If it is determined that the IC degraded in accordance with the lifetime LT stored in the memory unit 110 or the performance circuit 150 as a result of an aging stress of the TEGs, the apparatus 100 may suspend operations of the first to fourth IP blocks 152, 154, 156, and 158 (operation S360).

For example, when an operation of the third IP block 156 is suspended, power that is supplied to the third IP block 156 may be blocked.

If it is determined that any one of the first to fourth IP blocks 152, 154, 156, and 158 was defective or failed during an operation of the IC before the lifetime LT stored in the memory unit 110 or the performance circuit 150 as a result of an aging stress of the TEGs, the defective or failed IP block may be replaced with the redundancy IP block 160 (operation S370). For example, when the fourth IP block 158 is defective or failed before the lifetime LT, the fourth IP block 158 may be replaced with the redundancy IP block 160 having the same function and performance as the fourth IP block 158.

Figure 4:
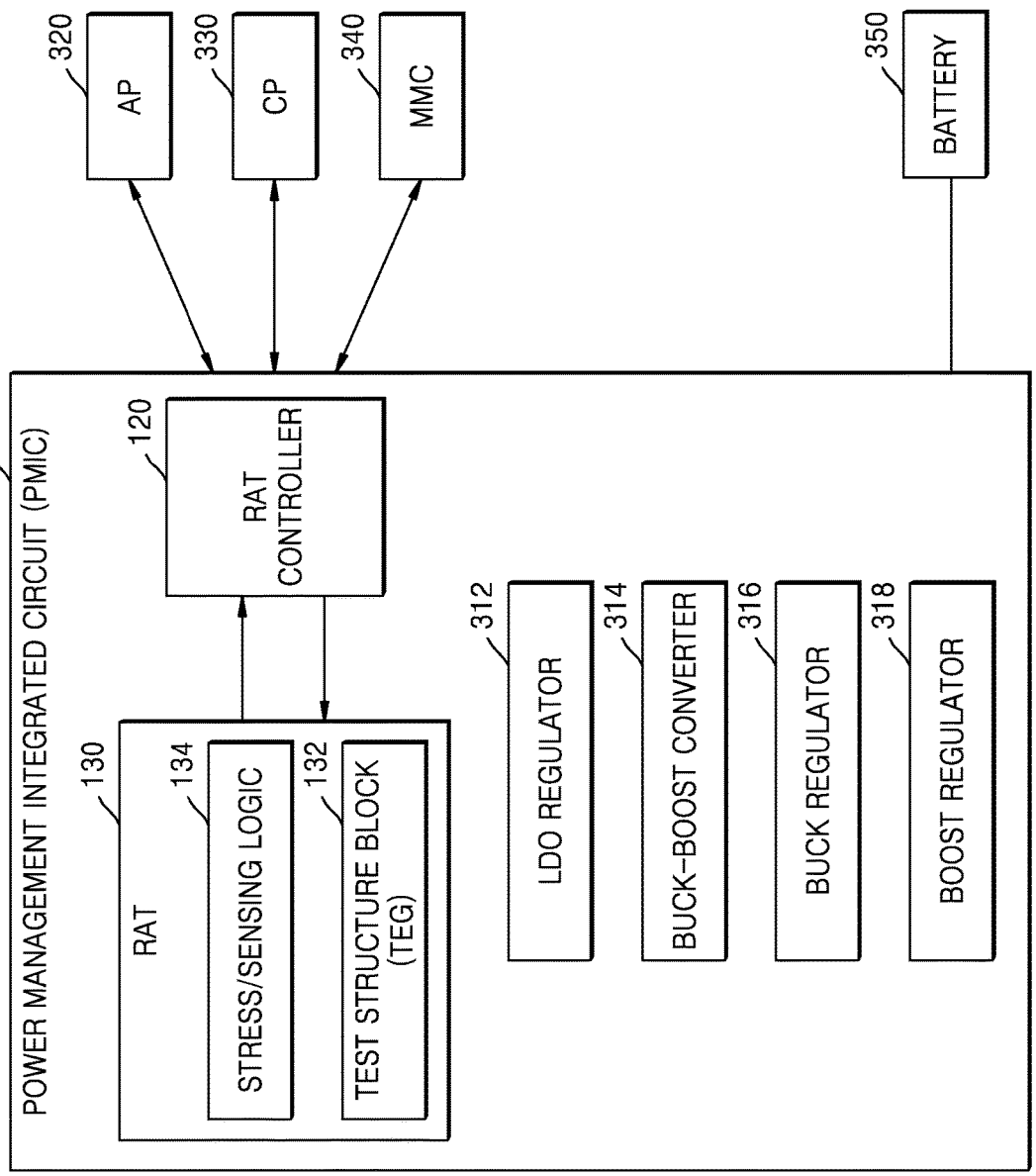
FIG. 4 is a diagram illustrating a power management integrated circuit (PMIC) including an RAT, according to an example embodiment.

FIG. 4 is a diagram illustrating a power management integrated circuit (PMIC) 310 including an RAT 130, according to an example embodiment. Depending on the portability and miniaturization of electronic devices, a PMIC may be used to provide stable power to the electronic devices. For convenience of explanation, the electronic devices may be described as portable terminals.

Referring to FIG. 4, the PMIC 310 may generate operating power of elements of a portable terminal, for example, an application processor (AP) 320, a communication processor (CP) 330, a multi-media card (MMC) 340, or the like and may provide the generated operating power to the elements of the portable terminal. The AP 320 may process various applications of the portable terminal. The AP 320 may control operations of a display unit, a touch panel, a camera, or the like to process the applications of the portable terminal. The CP 330 may perform a communication function of the portable terminal. The MMC 340 may be used as a memory device of a portable terminal.

The PMIC 310 may generate the operating power of the AP 320, the CP 330, and the MMC 340 by using a charging voltage of a battery 350 and supply the generated operating voltage to the AP 320, the CP 330, and the MMC 340. The PMIC 310 may include a low-dropout (LDO) regulator 312, a buck-boost converter 314, a buck regulator 316, a boost regulator 318, an RAT controller 120, and the RAT 130.

The LDO regulator 312, which may be a linear voltage regulator operating with a very small input-output differential voltage, may regulate an output voltage of the buck-boost converter 314 to generate the operating power of the AP 320, the CP 330, and the MMC 340. The LDO regulator 312 may be provided to correspond to the number of operating powers that are used in the portable terminal.

The buck-boost converter 314 may sense a voltage of the battery 350 and may operate in a buck-mode when the voltage of the battery 350 is higher than an output voltage of the buck-boost converter 314 and operate in a boost-mode when the voltage of the battery 350 is lower than the output voltage of the buck-boost converter 314, and thus may always generate a constant output voltage.

The buck regulator 316, which may be a voltage decrease-type DC/DC converter, may decrease an input voltage to thereby generate a set voltage. The buck regulator 316 may use a switching device switching between an ON state and an OFF state at a regular cycle and may have a structure in which input power may be supplied to a circuit while the switching device is turned on and may not be supplied to the circuit while the switching device is turned off. The buck regulator 316 may output a DC voltage by averaging, through an LC filter, a pulse-shaped voltage indicating a state in which the input power may be periodically supplied or not supplied to the circuit in this manner. In detail, the buck regulator 316 may form an output voltage by averaging a pulse voltage made by periodically chopping the DC voltage, and the output voltage of the buck regulator 316 has a level that may always lower than an input voltage of the buck regulator 316, that is, the output voltage of the battery 350.

The boost regulator 318 may be a boost-type DC/DC converter. In the boost regulator 318, when a switch is turned on, an input voltage, that is, the output voltage of the battery 350, may be applied between both terminals of an inductor, and thus, the inductor may be charged with a current. In addition, when the switch is turned off, the charged current may be transferred to a load. Accordingly, a current of the output terminal of the boost regulator 318 may be less than a current of the input terminal of the boost regulator 318. Since there is no loss in the operation of the boost regulator 318 in principle, the output voltage of the boost regulator 318 may be higher than the input voltage of the boost regulator 318, based on the relation "input current×input voltage=output current×output voltage".

The RAT controller 120 of the PMIC 310 may control aging target conditions ATC of the RAT 130 according to a lifetime LT of a portable terminal and apply stresses to TEGs of the RAT 130 according to the aging target conditions ATC. The RAT 130 may monitor and sense characteristics of the TEGs, which may vary due to the stresses applied according to the aging target conditions ATC during an operation of the portable terminal. The RAT controller 120 may determine whether characteristic degradation of the TEGs occurred, based on the sensed characteristics of the TEGs, and may selectively control operations of the AP 320, the CP 330, and the MMC 340 according to a determined result. The RAT controller 120 and the RAT 130 may be shared by the AP 320, the CP 330, and the MMC 340.

If it is determined that the characteristics of the TEGs did not degrade as a result of stress of the RAT 130, the RAT controller 120 may allow the AP 320, the CP 330, and the MMC 340 to continuously operate. If it is determined that the characteristics of the TEGs degraded in accordance with a lifetime as a result of stress of the RAT 130, the RAT controller 120 may suspend operations of the AP 320, the CP 330, and the MMC 340. If it is determined that an IP block included in the AP 320, the CP 330, or the MMC 340 was defective or failed before the lifetime as a result of stress of the RAT 130, the RAT controller 120 may replace the IP block with a redundancy IP block.

Figure 5:
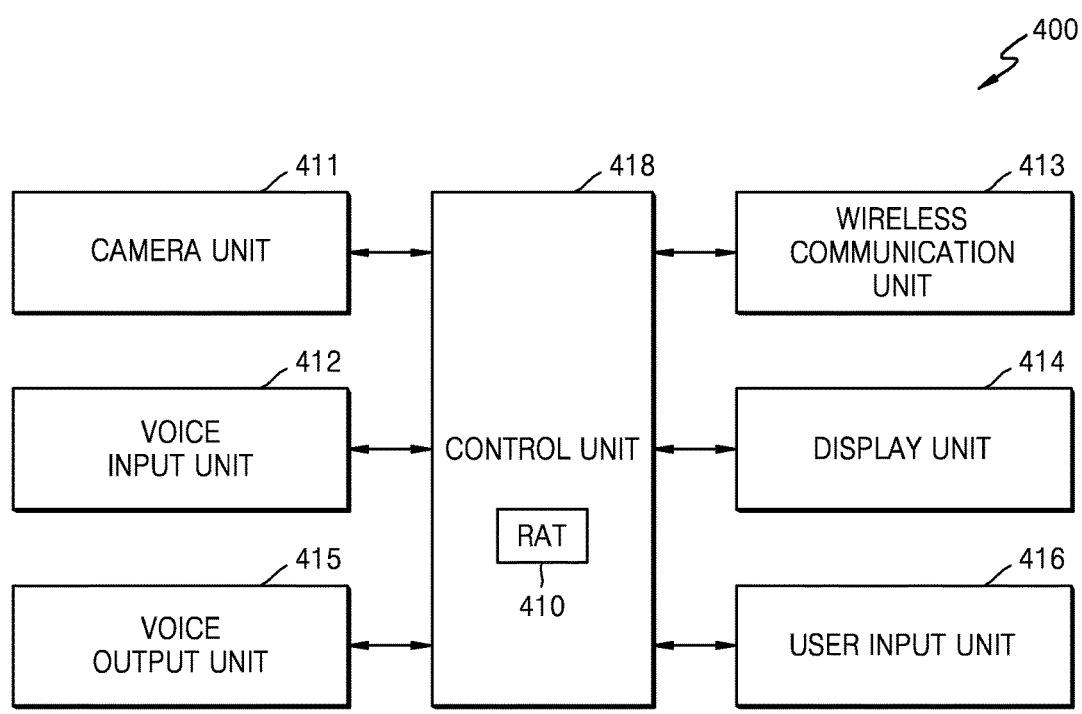
FIG. 5 is a block diagram of a system including an RAT, according to an example embodiment.

FIG. 5 is a block diagram of a system 400 including an RAT 410, according to an example embodiment.

Referring to FIG. 5, the system 400 (hereinafter, referred to as a mobile terminal system) may be a mobile terminal having a wireless network communication function and may be implemented as various types of apparatuses, such as a mobile phone, a laptop PC, and a personal digital assistant (PDA). The mobile terminal system 400 may perform a call function enabling a call between a caller and a receiver. Examples of the call function that may be performed by the mobile terminal system 400 may include a video call function, which enables a call while sending and receiving videos and voices, as well as a voice call function.

A communication method that may be performed by the mobile terminal system 400 may be, for example, Wideband Code Division Multiple Access (W-CDMA), Enhanced Data rates for GSM Evolution (EDGE), Long Term Evolution (LTE), or Worldwide Interoperability for Microwave Access (WiMAX). A wireless network may include a plurality of base station transmission systems for transmitting or receiving wireless communication signals to or from a plurality of mobile terminal systems 400, a base station controller for controlling and managing the plurality of base station transmission systems, and a switchboard for performing a call switching between the plurality of mobile terminal systems 400 through the base station controller.

The mobile terminal system 400 may include a camera unit 411, a voice input unit 412, a wireless communication unit 413, a display unit 414, a voice output unit 415, a user input unit 416, and a control unit 418. The camera unit 411, the voice input unit 412, the wireless communication unit 413, the display unit 414, the voice output unit 415, the user input unit 416, and the control unit 418 may be implemented with separate semiconductor ICs or may be implemented with semiconductor IP. The mobile terminal system 400 may be implemented with a SoC.

The camera unit 411 may take a photograph to generate an image. The camera unit 411 may include an optical unit that includes at least one lens receiving light, and an image sensor that converts the light received through the at least one lens into electrical data and generates an image. The image sensor of the camera unit 411 may be a RAW-Bayer and/or CMOS type of image sensor that is operated by an image processing unit through a sensor interface. The image sensor of the camera unit 411 may include a plurality of photodetectors configured to convert light detected by the image sensor into an electrical signal. The image sensor may further include a color filter array that filters light captured by the image sensor and captures color information. The voice input unit 412 may include a voice sensor, such as a microphone, to receive voices that are needed for a voice call.

The wireless communication unit 413 may be connected to a wireless network and communicate with another terminal by using a desired and/or predetermined wireless communication method. The wireless communication unit 413 may transmit video call data, which includes an image generated by the camera unit 411 and/or a voice input through the voice input unit 412, to the other terminal according to the control of the control unit 418 during a call, and may receive video call data including an image and/or a voice from the other terminal according to the control of the control unit 418.

The display unit 414 may display a screen and include a display device such as a liquid crystal display (LCD). The display unit 414 may display the image generated by the camera unit 411, based on the control of the control unit 418.

The voice output unit 415 may output voices and include a voice output device such as an internal speaker. Also, the voice output unit 415 may further include a connector for a connection with an external voice output device, such as an earphone, a headset, and an external speaker, and may output voices to the external voice output device connected through the connector. The voice output unit 415 may output voices received from the other terminal, according to the control of the control unit 418 during a voice call or a video call.

The user input unit 416 may receive a user's input for an operation of the mobile terminal system 400. The user input unit 416 may include a keypad including a plurality of keys for inputs, such as numbers and letters. The keypad may be implemented in the form of a touch pad. The user input 416 may further include a sensor for sensing a user's input, that is, a user's motion or gesture on the display unit 414. The sensor of the user input unit 416 may be implemented with a touch screen that is disposed to overlap a panel-type display device (for example, LCD) of the display unit 414.

The control unit 418 may perform the overall control of the mobile terminal system 400. When a call function is selected by a user's input through the user input unit 416, the control unit 418 may request a call switching to the other terminal through the wireless communication unit 413 with reference to an input phone number. When the call switching is performed, the control unit 418 may transmit call data, which may include an image generated by the camera unit 411 and/or a voice input through the voice input unit 412, to the other terminal through the wireless communication unit 413, and may perform a control function so that an image and/or voice included in call data that may be received from the other terminal through the wireless communication unit 413 may be output to the display unit 414 and/or the voice output unit 415.

The control unit 418 may perform a plurality of image processing operations through an image processing pipeline on image data captured by the image sensor of the camera unit 411. A processed result image may be displayed on the display unit 414. As the resolution and frame rate of image data to be processed increase, an image signal processing system that is matched with the increased resolution and frame rate may be required.

The control unit 418 may include the RAT 410 that may apply stress to a test pattern based on an aging target condition according to a lifetime requested, desired, demanded and/or required by a customer, or the like, using the mobile terminal system 400 and senses a stress result. If it is determined that the control unit 418 degraded before the lifetime as the stress result, the RAT 410 may refresh an operation of the control unit 418. If it is determined that the control unit 418 did not degrade as the stress result, the RAT 410 may allow the control unit 418 to continuously operate.

If it is determined that the control unit 418 degraded in accordance with the lifetime as the stress result, the RAT 410 may suspend an operation of the control unit 418. If it is determined that an IP block included in the control unit 418 was defective or failed before the lifetime as the stress result, the RAT 410 may replace the defective or failed IP block with a redundancy IP block.

The RAT 410 may be shared by the camera unit 411, the voice input unit 412, the wireless communication unit 413, the display unit 414, the voice output unit 415, and/or the user input unit 416. Accordingly, a chip area of the mobile terminal system 400 may be reduced. If it is determined that the control unit 418 did not degrade as the stress result, the RAT 410 may allow the camera unit 411, the voice input unit 412, the wireless communication unit 413, the display unit 414, the voice output unit 415, and/or the user input unit 416 to continuously operate. If it is determined that the control unit 418 degraded in accordance with the lifetime as the stress result, the RAT 410 may suspend operations of the camera unit 411, the voice input unit 412, the wireless communication unit 413, the display unit 414, the voice output unit 415, and/or the user input unit 416. If it is determined that an IP block, which may be included in the camera unit 411, the voice input unit 412, the wireless communication unit 413, the display unit 414, the voice output unit 415, and/or the user input unit 416, was defective or failed before the lifetime as the stress result, the RAT 410 may replace the defective or failed IP block with a redundancy IP block.

Figure 6:
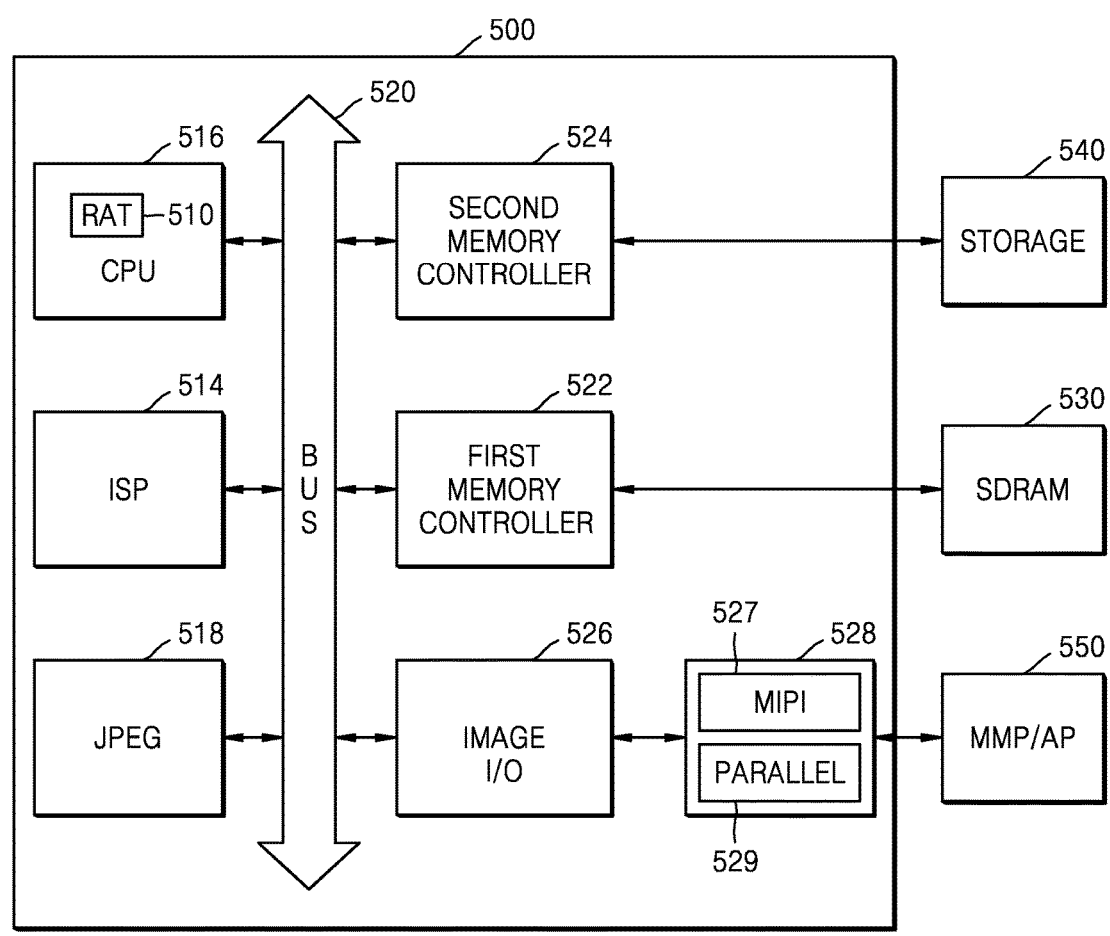
FIG. 6 is a block diagram of a system including an RAT, according to another example embodiment.

FIG. 6 is a block diagram of a system 500 including an RAT 510, according to another example embodiment.

Referring to FIG. 6, the system 500 (hereinafter, referred to as an image processing system) may be an image processing system included in the control unit 418 of FIG. 5. The image processing system 500 may include an image signal processor (ISP) 514, a central processing unit (CPU) 516, an image codec unit 518, first and second memory controllers 522 and 524, an image input/output (I/O) unit 526, and an interface unit 527. The ISP 514, the CPU 516, the image codec unit 518, the first and second memory controllers 522 and 524, the image I/O unit 526, and the interface unit 527 may be implemented with separate semiconductor ICs or may be implemented with semiconductor IP.

The ISP 514 may include a Bayer processing unit, an RGB processing unit, and/or a scaling/rotating/affine-transform processing unit. The ISP 514 may control an image size, a color depth, a dead pixel alive function, a lens shading compensation function, an adaptive color interpolation function, a color correction function, a gamma control function, a hue/gain control function, an image effect function, an auto exposure function, and/or an auto white balance function to control the processing of each unit. Image data processed by the ISP 514 may be transmitted to the image codec unit 518 via a bus 520.

The image codec unit 518 may encode or decode the image data to facilitate the transmission and storage of the image data. The image codec unit 518 may be formed by using a joint photographic experts group (JPEG) codec to generate a high resolution JPEG image. The JPEG codec compresses image data for each block unit. Also, the JPEG codec may scan a block data compression stream of a location, which is desired to be decoded, from the beginning of a file, and may search for the location, and then may restore and reproduce the block data compression stream of the location.

A baseline JPEG that corresponds to a minimum specification of a JPEG compression may convert image data from RGB to YIQ, divide an image of each of the color components (Y, I, G) into macro blocks of 8×8 block units, and then perform a discrete cosine transform (DCT) on the macro blocks. DCT coefficients that are result values of the DCT may be linearly quantized based on a different step size for each of the DCT coefficients by using a quantization table to separate visually important parts from visually less important parts, and the amount of data may be reduced by maintaining the important parts and losing the less important parts. 8×8 block data is the smallest encoding unit, and the size of block data may be changed when the smallest encoding unit is changed.

The DCT coefficients quantized in macro block units may include 1 direct current (DC) component and 63 alternating current (AC) components. The DC component may be obtained by encoding differential signals between a current macro block and an adjacent previous macro block in consideration of a correlation between adjacent signals (Differential Pulse Code Modulation (DPCM)). The AC components may be obtained by listing coefficients in line by a zigzag scan for each macro block and then encoding the coefficients (Run-Length Coding).

A JPEG image compressed by a JPEG compression method may include a plurality of macro blocks between which boundaries are formed, and each of the plurality of macro blocks may be composed of one DC component and an end of block (EOC) code indicating the end of each macro block. Each of the macro blocks constituting the JPEG image may have mutually dependent DC values. The ISP 514 may correct an image to reduce noise of JPEG image data. The ISP 514 may adjust DC/AC coefficients of 8×8 block data. The ISP 514 may separate an image area from the block data according to a DC/AC threshold value and then reduce noise by adjusting and controlling the DC/AC coefficients (Noise reduction). The ISP 514 may reduce block noise by adjusting AC coefficients (Blocky effect reduction). Also, the ISP 514 may adjust DC/AC coefficients to thereby apply brightness enhancement to the block data.

The CPU 516 may be a microprocessor including hardware, software, and/or firmware which are needed to implement a method of processing the image data described above. The CPU 516 may include a graphics processing unit (GPU), which may be referred to as a video processing unit (VPU), to handle a series of complicated processes related to processing the image data.

The CPU 516 may perform manipulation and rendering of a graphic image, which may be used in various electronic games and applications to attract attention. The CPU 516 may receive commands and image data, such as a software application, from a host. The commands may be used to specify a calculation and an operation, which may be needed to generate an image rendered by changing the image data.

The CPU 516 may control additional process functions, such as a camera function and a multimedia data reproduction function. The CPU 516 may reduce, enlarge, or crop image data so as to be suitable for the size of the display unit 414 of FIG. 5, and may change the image data so as to be suitable for a color standard of image data that is displayed by the display unit 414 of FIG. 5.

Commands or image data to be processed by the CPU 516 may be stored in a memory device 530. The memory device 530 may be an external memory device that is outside the image processing system 500. The image processing system 500 may control the memory device 530 through the first memory controller 522. The memory device 530 may be a volatile memory such as synchronous dynamic random access memory (SDRAM). The first memory controller 522 may be an SDRAM controller for controlling an operation of the SDRAM. The memory device 530 may store a basic input/output system (BIOS), an operating system (OS), various programs, applications, or firmware having a user interface function.

The memory device 530 may store original image data that is received from the image sensor of the camera unit 411 of FIG. 5. The original image data stored in the memory device 530 may be provided to the ISP 514.

The memory device 530 may be used for buffering or caching during an operation of the image processing system 500. For example, the memory device 530 may include one or more frame buffers for buffering image data when the image data is output to the display unit 414 of FIG. 5. That is, the memory device 530 may store image data before the processing of the image data, during the processing of the image data, and after the processing of the image data.

In addition to the memory device 530, the image processing system 500 may be connected to a nonvolatile storage device 540 to permanently store image data and/or commands. The image processing system 500 may be connected to the nonvolatile storage device 540 through the second memory controller 524. The nonvolatile storage device 540 may be controlled by the second memory controller 524. The nonvolatile storage device 540 may be an external storage device that is outside the image processing system 500.

The nonvolatile storage device 540 may include a flash memory, a hard drive, an optical, magnetic, and/or solid state storage medium, or a combination thereof. The second memory controller 524 may be a flash memory controller for controlling a flash memory. Although the nonvolatile storage device 540 in FIG. 5 is a single device, the nonvolatile storage device 540 may include a combination of one or more storage devices selected from the above-stated storage devices operating in connection with the image processing system 500.

The nonvolatile storage device 540 may be used for storing firmware, data files, image data, software programs and applications, wireless connection information, personal information, user preferences and any other data. Image data stored in the nonvolatile storage device 540 and/or the memory device 530 may be processed by the image processing system before being output to a display.

As described above, original image data captured through the image sensor of the camera unit 411 of FIG. 5 may be stored in the memory device 530 through the image processing system 500. In addition, image data stored in an electronic device such as a computer may also be stored in the memory device 530 through the image processing system 500. The memory device 530 may transmit original image data or JPEG image data, stored in the memory device 530, to the display unit 414 of FIG. 5. The display unit 414 may display image data or may display a menu and a command as a portion of a user interface.

Multimedia, such as the camera unit 411, a computer, and/or the display unit 414, may be controlled by a multimedia processor (MMP) or an application processor (AP) to perform additional functions, such as a camera function, a multimedia file reproduction function, and a three-dimensional (3D) graphic function. An operation mode of the camera function that is performed by the MMP may be divided into a preview mode and a multimedia operation mode. The preview mode is a mode for preview before camera photographing, and the multimedia operation mode is a mode for performing a photographing operation by a camera photographing command input.

The image processing system 500 may be referred to as a front-end processor for image data. The MMP and/or the AP correspond to a subsequent processor and thus may be referred to as a back-end processor 550. The back-end processor 550 may be connected to the camera unit 411, a computer, and/or the display unit 414. The image processing system 500 may transmit image data stored in the memory device 530 to the back-end processor 550 through the image I/O unit 526.

The image I/O unit 526 may transmit original image data output from the image sensor of the camera unit 411 to the back-end processor 550. The image I/O unit 526 may transmit image data adjusted to be suitable for the size of the display unit 414 connected to the back-end processor 550. Also, the image I/O unit 526 may output image data changed to be suitable for a color standard of image data that may be displayed by the display unit 414. The interface unit 527 for performing image data exchange may be connected between the image I/O unit 526 and the back-end processor 550.

The interface unit 527 may include an MIPI 528, which may transmit a frame that may be the unit of image data transmission, and/or a parallel interface 529. The frame may include addresses and essential protocol control information as well as actual image information. The frame may be transmitted by units of bits and may include a head field before data and a trailer field after the data. The parallel interface 529 may be used in the case that image data has low resolution and a low frame rate. The MIPI 528, which is a high speed serial interface, may be used when transmitting image data having high resolution and a high frame rate.

The CPU 516 may include the RAT 510 that may apply stress to a test pattern under an aging target condition according to a customer demand lifetime and may sense a stress result. If it is determined that the CPU 516 degraded before a lifetime as the stress result, the RAT 510 may refresh operations of the CPU 516, the ISP 514, the image codec unit 518, the first and second memory controllers 522 and 524, the image I/O unit 526, and/or the interface unit 527. If it is determined that the CPU 516 did not degrade as the stress result, the RAT 410 may allow the CPU 516, the ISP 514, the image codec unit 518, the first and second memory controllers 522 and 524, the image I/O unit 526, and/or the interface unit 527 to continuously operate. If it is determined that the CPU 516 degraded in accordance with the lifetime as the stress result, the RAT 410 may suspend operations of the CPU 516, the ISP 514, the image codec unit 518, the first and second memory controllers 522 and 524, the image I/O unit 526, and/or the interface unit 527. If it is determined that an IP block included in the CPU 516, the ISP 514, the image codec unit 518, the first and second memory controllers 522 and 524, the image I/O unit 526, or the interface unit 527 was defective or failed before the lifetime as the stress result, the RAT 410 may replace the defective or failed IP block with a redundancy IP block.

The units, controllers, and/or blocks described herein may be implemented using hardware components, software components, or a combination thereof. For example, the hardware components may include microcontrollers, memory modules, sensors, amplifiers, audio to digital converters, and processing devices, or the like. A processing device may be implemented using one or more hardware device configured to carry out and/or execute program code by performing arithmetical, logical, and input/output operations. The processing device(s) may include a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct and/or configure the processing device to operate as desired, thereby transforming the processing device into a special purpose processor. Software and data may be embodied permanently or temporarily in any type of machine, component, physical or virtual equipment, or computer storage medium or device. The software also may be distributed over network coupled computer systems so that the software is stored and executed in a distributed fashion. The software and data may be stored by one or more non-transitory computer readable recording mediums.

The methods according to the above-described example embodiments may be recorded in non-transitory computer-readable media including program instructions to implement various operations of the above-described example embodiments. The media may also include, alone or in combination with the program instructions, data files, data structures, and the like. The program instructions recorded on the media may be those specially designed and constructed for the purposes of some example embodiments, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blu-ray discs; magneto-optical media such as optical discs; and hardware devices that are specially configured to store and perform program instructions, such as read-only memory (ROM), random access memory (RAM), flash memory (e.g., USB flash drives, memory cards, memory sticks, etc.), and the like. Examples of program instructions include both machine code, such as produced by a compiler, and files containing higher level code that may be executed by the computer using an interpreter. The above-described devices may be configured to act as one or more software modules in order to perform the operations of the above-described example embodiments, or vice versa.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method of using a reliability aging timer (RAT), the method comprising:
    inputting a lifetime of an integrated circuit (IC) into memory of the reliability aging timer (RAT);
    setting an aging target condition of the RAT according to the lifetime of the IC;
    applying stress to a test pattern of the RAT according to the aging target condition and sensing a result of the stress;
    determining whether an IC has degraded before the end of the lifetime of the IC as a result of the stress; and
    refreshing an operation of the IC if the determining has determined that the IC degraded before the end of the lifetime of the IC as a result of the stress, the refreshing the operation of the IC including at least one of adjusting a power level that is supplied to the IC or adjusting a voltage level of a signal that is input to the IC.

2. The method of claim 1, wherein the inputting of the lifetime of the IC comprises inputting a lifetime in accordance with a desired lifetime of the IC.

3. The method of claim 1, further comprising:
    continuing an operation of the IC if the determining has determined that the IC did not degrade as a result of the stress.

4. The method of claim 1, further comprising:
    suspending an operation of the IC if the determining has determined that the IC degraded in accordance with the lifetime of the IC as a result of the stress.

5. The method of claim 1, further comprising:
    replacing an intellectual property (IP) block included in the IC with a redundancy IP block if the determining has determined that the IP block included in the IC was defective or failed before the end of the lifetime of the IC as a result of the stress.

6. The method of claim 1, wherein the applying of the stress to the test pattern of the RAT and the sensing of the result of the stress comprises:
    applying a drain voltage of an N-type metal oxide semiconductor (NMOS) transistor of the IC to a hot carrier injection (HCI) test pattern for evaluation of characteristics of the NMOS transistor and sensing a drain-source current;
    applying a gate voltage of a P-type metal oxide semiconductor (PMOS) transistor of the IC to a negative biased temperature instability (NBTI) test pattern for evaluation of characteristics of the PMOS transistor and sensing a drain-source current;
    applying a gate voltage of a transistor gate dielectric layer of the IC to a time dependent dielectric breakdown (TDDB) test pattern for evaluation of characteristics of the transistor gate dielectric layer and sensing a gate current; and
    applying a current to a stress migration (SM) test pattern or electro-migration (EM) test pattern for evaluation of characteristics of an interconnection layer and a via in the IC and sensing whether a short circuit occurs due to the current.

7. The method of claim 1, wherein the applying of the stress to the test pattern of the RAT comprises using a temperature adjustor, the temperature adjustor configured to measure a temperature of the test pattern and adjust the temperature of the test pattern of the RAT to maintain a temperature suitable for the lifetime of the IC according to the stress.

8. A method of ensuring the reliability of an integrated circuit (IC) by controlling a reliability aging timer (RAT), comprising:
    setting a desired performance expectancy for a plurality of intellectual property (IP) blocks;
    determining stress conditions to be used in a stress test of the IP blocks based on the desired performance expectancy;
    performing a stress test in accordance with the stress conditions on at least one of the plurality of IP blocks;
    monitoring results of the stress test on the at least one of the plurality of IP blocks;
    determining whether degradation of the at least one of the plurality of IP blocks has occurred based on the results of the stress test; and
    performing an operation of the IC based on results of the determining, wherein
    the desired performance expectancy includes a desired lifetime of the plurality of IP blocks.

9. The method of claim 8, comprising:
    determining whether the degradation of the at least one of the plurality of IP blocks is in accordance with the desired performance expectancy.

10. The method of claim 8, wherein the at least one of the plurality of IP blocks is a performance test IP block.

11. The method of claim 8, wherein the performing the stress test includes performing at least one of a hot carrier injection test, a negative biased temperature instability test, a time dependent dielectric breakdown test, a stress migration test, and an electro-migration test.

12. The method of claim 8, wherein the operation of the IC is at least one of:
    refreshing an operation of the IC, continuing an operation of the IC, suspending an operation of the IC, and replacing an intellectual property (IP) block included in the IC with a redundancy IP block.

13. The method of claim 12, wherein the refreshing the operation of the IC includes at least one of adjusting a power level that is supplied to the IC or adjusting a voltage level of a signal that is input to the IC.

14. A non-transitory computer readable medium including computer readable instructions, which when executed by at least one controller of an integrated circuit (IC), causes the controller to:
- set a desired performance expectancy for a plurality of intellectual property (IP) blocks;
- determine stress conditions to be used in a stress test of the IP blocks based on the desired performance expectancy;
- perform a stress test in accordance with the stress conditions on at least one of the plurality of IP blocks;
- monitor results of the stress test on the at least one of the plurality of IP blocks;
- determine whether degradation of the at least one of the plurality of IP blocks has occurred based on the results of the stress test; and
- perform an operation of the IC based on results of the determining, wherein
- the desired performance expectancy includes a desired lifetime of the plurality of IP blocks.

15. The non-transitory computer readable medium of claim 14, wherein the at least one controller is further caused to:
- determine whether the degradation of the at least one of the plurality of IP blocks is in accordance with the desired performance expectancy.

16. The non-transitory computer readable medium of claim 14, wherein the at least one of the plurality of IP blocks is a performance test IP block.

17. The non-transitory computer readable medium of claim 14, wherein the performing the stress test includes performing at least one of a hot carrier injection test, a negative biased temperature instability test, a time dependent dielectric breakdown test, a stress migration test, and an electro-migration test.

18. The non-transitory computer readable medium of claim 14, wherein the operation of the IC is at least one of:
- refreshing an operation of the IC, continuing an operation of the IC, suspending an operation of the IC, and replacing an intellectual property (IP) block included in the IC with a redundancy IP block.

19. The non-transitory computer readable medium of claim 18, wherein the refreshing the operation of the IC includes at least one of adjusting a power level that is supplied to the IC or adjusting a voltage level of a signal that is input to the IC.

* * * * *